United States Patent
Cline et al.

(10) Patent No.: US 6,249,693 B1
(45) Date of Patent: Jun. 19, 2001

(54) METHOD AND APPARATUS FOR CARDIAC ANALYSIS USING FOUR-DIMENSIONAL CONNECTIVITY AND IMAGE DILATION

(75) Inventors: Harvey Ellis Cline, Schenectady; Siegwalt Ludke, Scotia, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/431,953

(22) Filed: Nov. 1, 1999

(51) Int. Cl.[7] .................................................. A61B 5/00
(52) U.S. Cl. ................................................... 600/410
(58) Field of Search ..................... 600/410, 443; 382/128; 345/424

(56) References Cited

U.S. PATENT DOCUMENTS

| | | | |
|---|---|---|---|
| 5,239,591 | 8/1993 | Ranganath | 382/6 |
| 5,273,040 | * 12/1993 | Apicella et al. | 128/653.2 |
| 5,291,891 | 3/1994 | Foo et al. | 128/653.2 |
| 5,377,680 | 1/1995 | Bernstein et al. | 128/653.2 |
| 5,412,563 | 5/1995 | Cline et al. | 364/413.22 |
| 5,433,199 | 7/1995 | Cline et al. | 128/653.1 |
| 5,435,310 | 7/1995 | Sheehan et al. | 128/653.1 |
| 5,458,126 | 10/1995 | Cline et al. | 128/653.1 |
| 5,545,992 | 8/1996 | Foo | 324/309 |
| 5,669,382 | 9/1997 | Curwen et al. | 128/653.1 |
| 5,846,200 | * 12/1998 | Schartz | 600/433 |
| 5,871,019 | 2/1999 | Belohlavek | 128/916 |

OTHER PUBLICATIONS

Carlos Manhaeghe, Ignace Lemahieu, Dirk Vogelaers, and Francis Colardyn, "Automatic Initial Estimation of the Left Ventricular Myocardial Midwall in Emission Tomograms Using Kohonen Maps", IEEE Transactions on Pattern Analysis and Machine Intelligence, vol. 16, No. 3, Mar. 1994.

Giusseppe Coppini, Riccardo Poli, and Guido Valli, "Recovery of the 3–D Shape of the Left Ventricle from Echocardiographic Images", IEEE Transactions on Medical Imaging, vol. 14, No. 2, Jun. 1995.

John (Juyang) Weng, Ajit Singh, and M.Y. Chiu, "Learning–Based Ventricle Detection from Cardiac MR and CT Images", IEEE Transactions on Medical Imaging, vol. 16, No. 4, Aug. 1997.

* cited by examiner

*Primary Examiner*—Marvin M. Lateef
*Assistant Examiner*—Eleni Mantis Mercader
(74) *Attorney, Agent, or Firm*—Jean K. Testa; Marvin Snyder

(57) ABSTRACT

An imaging system enables cardiac functioning within a particular cardiac chamber to be imaged. The system acquires imaging data that includes intensity values for four-dimensional voxels within a region of interest (ROI). A seed voxel is identified, and neighbor voxels to the seed voxel are also identified. The intensity values for each neighbor voxel are compared to a threshold to determine whether the voxel corresponds to blood or muscle tissue. For each neighbor voxel corresponding to blood, its neighbor voxels are identified and compared to the threshold, and this process is repeated until a pre-established spatial boundary is encountered or the number of new neighbor voxels indicates that processing is migrating into an adjacent cardiac chamber. At that point, the set of identified blood voxels represents a blood volume for the desired cardiac chamber. Voxels adjacent to the interior and exterior surface boundaries of the blood volume are added to the set. At that point, the set of voxels are counted into bins of cardiac phases, cardiac images for each phase are reconstructed, and parameters such as ejection fraction are calculated.

20 Claims, 4 Drawing Sheets

METHOD AND APPARATUS FOR CARDIAC ANALYSIS USING FOUR-DIMENSIONAL CONNECTIVITY AND IMAGE DILATION

BACKGROUND OF THE INVENTION

The field of the invention is systems and methods for determining cardiac functionality within a living subject, and more particularly, to systems and methods for determining cardiac functionality from four-dimensional imaging data.

In the past few years, many non-invasive techniques for measuring blood flow and cardiac function in living subjects have been developed. Many of these techniques have particularly focused on determining the dynamic behavior of the left and right ventricles. Blood flow (a quantitative measure of blood flow through vessels), cardiac ejection fraction (the ratio of ventricle chamber volume between full dilation and full contraction), total cardiac output, and cardiac enlargement are parameters of interest which are significant in determining cardiac disease and failure.

Various imaging modalities have been used to determine these parameters, including ultrasound, X-ray and computed axial tomography (CAT) with contrast agents, and nuclear magnetic resonance (NMR) imaging. Prior-art methods for determining cardiac chamber volumes, for instance, involve using NMR to create four-dimensional (4-D) representations of the heart (i.e., three spatial dimensions and time). The determination of cardiac chamber volume requires multiple (e.g., 10 to 14) image slices to be created in order to obtain a full three-dimensional (3-D) image of the heart.

The various configurations of the heart in its cycle of dilation and contraction are referred to as phases, which include the extremes of end of diastole and end of systole. Synchronizing information obtained from an electrocardiogram (ECG) is used either to trigger the evolution of the sequences of the desired phases, or as a means for sorting of magnetic resonance (MR) signal samples obtained in a free-running fashion. In order to get complete information regarding cardiac function throughout an entire cardiac cycle, a full set of image slices typically are obtained at about 16 to 24 phases in the cardiac cycle.

In most clinical settings, prior-art methods of determining cardiac functionality involve an operator manually tracing, on a computer screen, the region of interest (ROI) (e.g., the boundary of the left ventricle) within each slice of data obtained at all cardiac phases of interest. A typical expert would require about 1.5 to 2 hours to segment 10 to 14 image slices obtained at 16 to 24 phases in the cardiac cycle. Because of the interaction time of the operator, these methods are not extremely efficient. Also, because the boundary between the inside of the chamber and the chamber wall may be obscure due to inadequate contrast, these techniques tend to be inaccurate. In addition, the results are difficult to reproduce because of the variation in the criteria used to manually trace the ROI from image to image, day to day, and operator to operator.

Other, more efficient techniques have been developed in which a gradient data set is constructed from image data indicating the magnitude of spatial changes in the image data set, and then an operator selects a number of sample points over various tissue classes of interest. Further processing results in identification of solid structures, which may indicate the internal volume of cardiac chambers. For example, U.S. Pat. Nos. 5,433,199 and 5,458,126, to Cline et al., entitled "Cardiac Functional Analysis System Employing Gradient Image Segmentation," both assigned to the same assignee as the present application, describe such techniques. Although these techniques are effective, they also require a significant amount of operator interaction, thus leading to potential problems of inaccuracy, reproducibility, and inefficiency.

What is needed is an accurate, reproducible, and efficient method and apparatus for in vivo measurement of cardiac function. What is further needed is a method and apparatus for 4-D cardiac analysis which is fully automatic, thus eliminating the need for operator interaction.

SUMMARY OF THE INVENTION

The method and apparatus of the preferred embodiment provide the ability to produce accurate and reproducible cardiac images without significant operator interaction. This is accomplished by an apparatus performing a method that first acquires a set of image data, where the image data includes intensity values for four-dimensional voxels within a region of interest. Next, a seed voxel is identified from the four-dimensional voxels, and neighbor voxels to the seed voxel are also identified. For each of the neighbor voxels, a determination is made whether an intensity value corresponding to each neighbor voxel indicates that the voxel is likely to correspond to blood or to muscle tissue. For the set of the neighbor voxels having the intensity values that are likely to correspond to blood, new neighbors are determined. The steps of determining whether the voxel intensity value indicates blood or muscle tissue and determining new neighbors are repeated until all voxels of interest have been evaluated, resulting in a final set of voxels. Each voxel of the final set of voxels has an intensity value that is likely to correspond to blood. An additional set of voxels, comprising voxels neighboring the final set of voxels and not likely to correspond to blood, are added to the final set of voxels. One or more cardiac images are then reconstructed from the final set of voxels.

DETAILED DESCRIPTION OF THE PREFERRED EMBODIMENT

Figure 1:
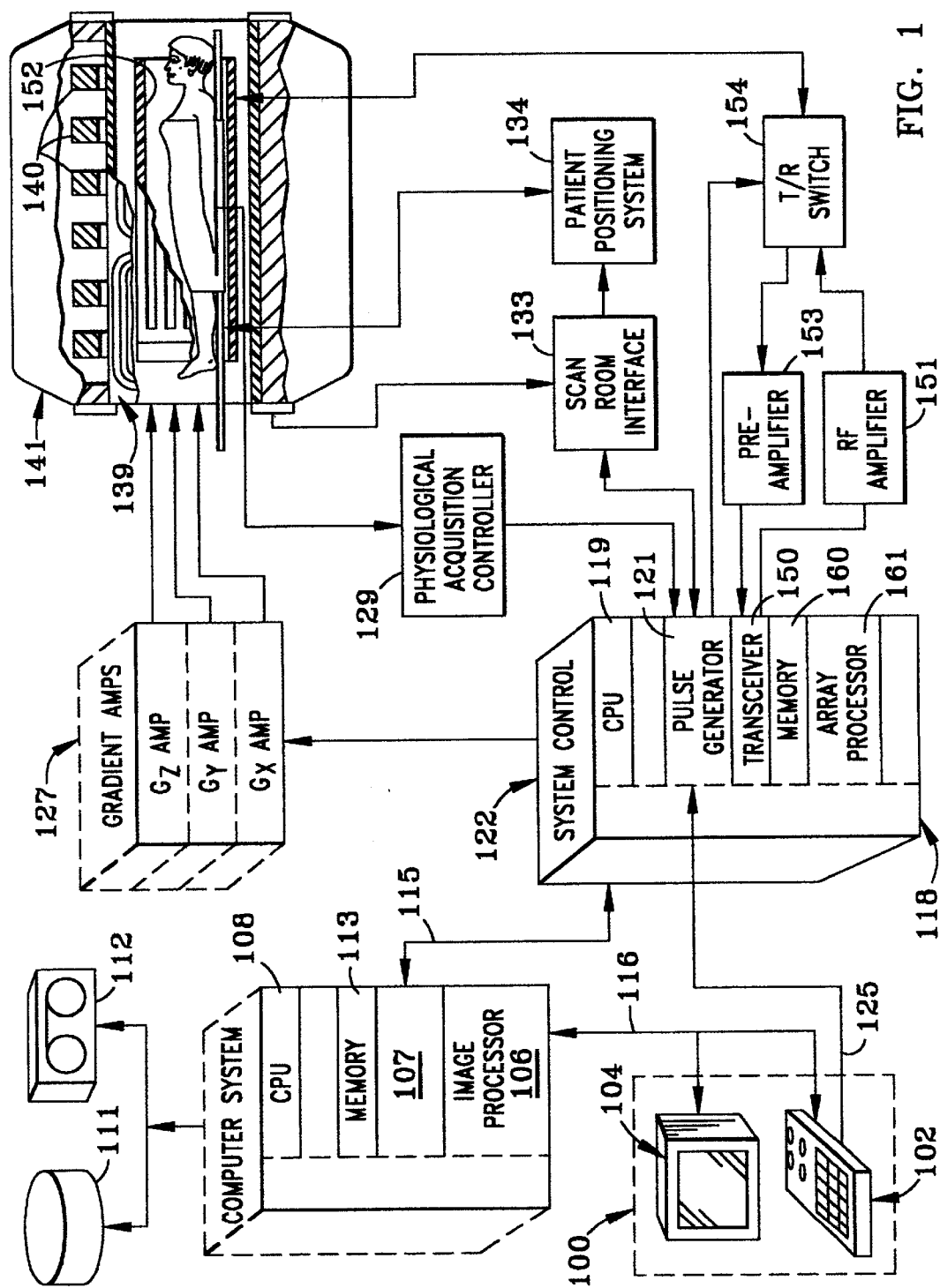
FIG. 1 illustrates a simplified block diagram of a system for determining cardiac functionality in accordance with a preferred embodiment.

FIG. 1 illustrates a simplified block diagram of a system for determining cardiac functionality in accordance with a preferred embodiment. In a preferred embodiment, the system is an NMR imaging system which incorporates the present invention. The NMR system could be, for example, a GE-Signa MR scanner available from GE Medical Systems, Inc., which is adapted to perform the method of the present invention, although other systems could be used as well.

The operation of the NMR system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength, and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data are conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736. In a preferred embodiment, the further processing performed by the image processor 106 involves a method for determining cardiac functionality using 4-D connectivity.

Figure 2:
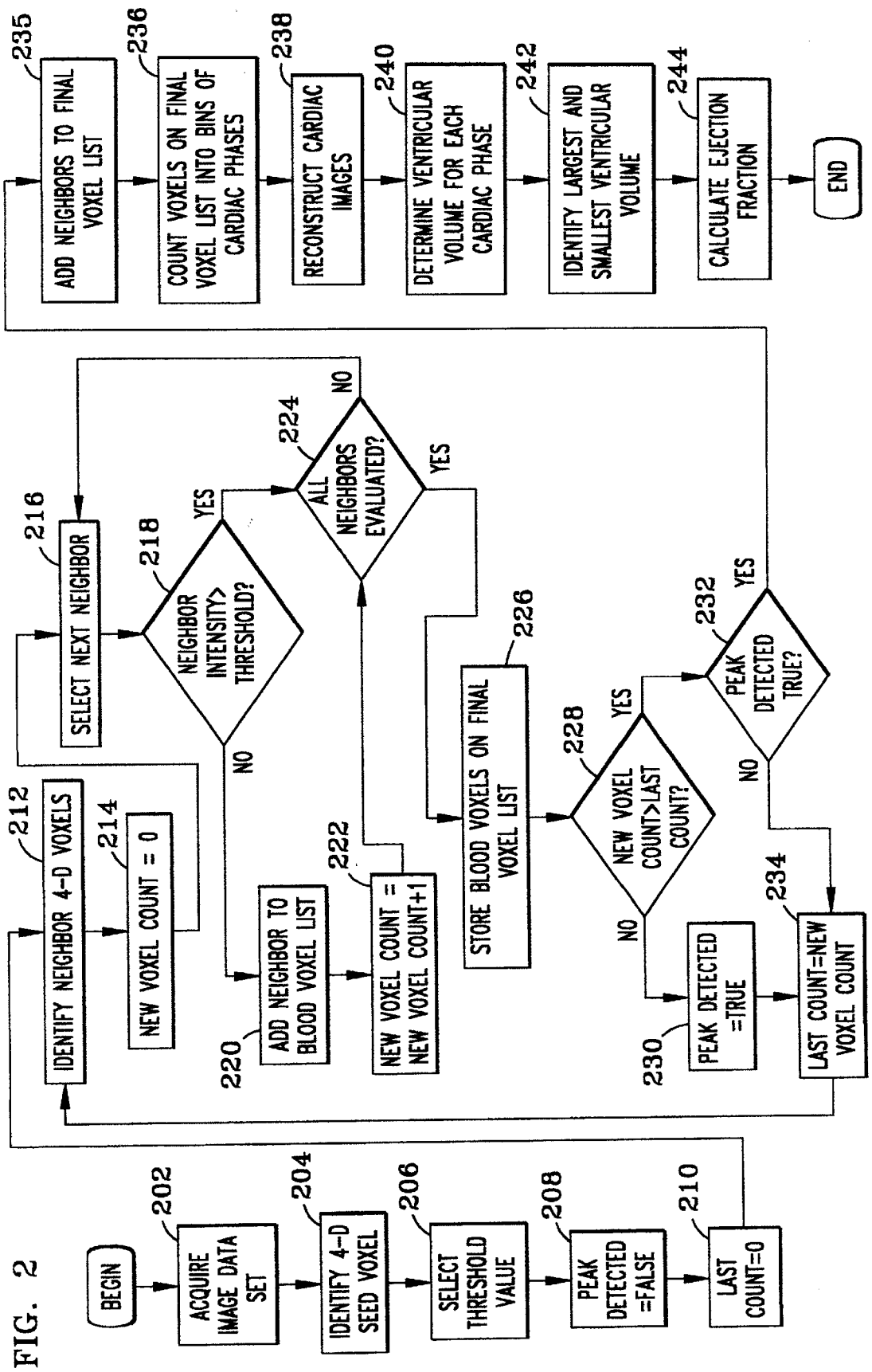
FIG. 2 illustrates a flowchart of a method for determining cardiac functionality in accordance with a preferred embodiment.

FIG. 2 illustrates a flowchart of a method for determining cardiac functionality in accordance with a preferred embodiment. In a preferred embodiment, the method is performed using an NMR system such as that illustrated in FIG. 1.

The method begins, in step 202, by acquiring an image data set. An image data set comprises a number of image data arrays that have been transformed by Fourier transformation, the arrays including intensity values for four-dimensional voxels within a region of interest (e.g., all or a portion of the heart). In a preferred embodiment, the acquisition step employs a gradient echo pulse sequence, and an operator would control various parameters associated with the acquisition such as, for example, the echo time (TE), repetition time (TR), flip angle, number of slices, slice thickness, and matrix size (in pixels). For example, the operator may use TE=10.1 milliseconds (ms), TR=30 ms, flip angle=30 degrees, number of slices=28, slice thickness= 1.5 millimeters (mm), and a 128×256 matrix size. Alternatively, each of these parameters could have higher or lower values, depending upon how the operator desires to control the imaging process, the desired resolution, and the size of the tissue sample being analyzed.

In the context of cardiac analysis, it is important to maintain information relating to the particular cardiac phase in which a certain set of image data is collected. By using 4-D voxels, where each voxel is described by three spatial variables and one temporal variable, timing information that corresponds to cardiac phases is maintained. In a preferred embodiment, timing and synchronizing information is obtained using an ECG, although other means could also be used to obtain this information. In order to get complete information regarding cardiac function throughout an entire cardiac cycle, a full set of image slices typically are obtained at about 16 to 24 phases in the cardiac cycle, although information could be obtained for more or fewer phases. The result of the acquisition step is a set of data that can be used to construct a 4-D image of the heart.

In step 204, a 4-D "seed voxel" is identified. The seed voxel is identified to the system manually by the operator or is identified automatically by the system. Desirably, the seed voxel is a voxel that is located roughly in the center region of the cardiac chamber being imaged (e.g., the left ventricle). The center is determined visually by the operator or automatically by the system. In addition, the seed voxel is desirably selected to correspond with the end diastole phase of cardiac function. Alternatively, the seed voxel is selected to be located in different spatial and/or phase positions.

When attempting to image a particular cardiac chamber, it is important to identify the chamber boundary or "surface of blood", which is the boundary between the blood in the chamber and the heart's muscle tissue. In the method of the preferred embodiment, this identification is facilitated using a "threshold value." Accordingly, in step 206, a threshold value is selected. The threshold could be selected manually by the operator or could be selected automatically by the system.

Because the image intensity of blood and muscle tissue is different, the threshold value is used to determine whether the intensity value of a voxel indicates that the voxel is likely to correspond to blood or to muscle tissue. In various other embodiments, other ways, besides using a threshold value, of determining whether the intensity value of the voxel indicates that the voxel is likely to correspond to blood or to muscle tissue could be employed.

In a preferred embodiment, in order to select a threshold value, a histogram of the patient's cardiac functioning is used to identify two intensity peaks in the image data. One peak corresponds to the intensity of blood voxels, and the other peak corresponds to the intensity of muscle tissue voxels. Typically, voxels corresponding to muscle have higher intensity values and voxels corresponding to blood have lower intensity values. In a preferred embodiment, the threshold is selected to be an intensity value that is roughly the average of the blood and muscle tissue intensity values. Alternatively, the threshold could be selected to be a value different from the average intensity value.

In alternate embodiments, other ways of determining whether a particular intensity value is likely to correspond to blood or muscle could be used. For example, rather than using a single threshold value, one or more ranges of values could be identified. When an intensity value falls within a particular range, the voxel could be identified as a blood voxel Next, in step 208, a "Peak Detected" boolean parameter is initialized to "false." The Peak Detected parameter is used, in a preferred embodiment, to determine when to stop processing the image data. Essentially, as will be described more fully below, processing starts with the seed voxel in a first iteration of the method. In subsequent iterations, new voxels to process are then identified by radiating, in three dimensions, outward from the seed voxel. The voxels identified to be processed during each iteration are analogous, therefore, to processing elements within subsequent layers of an onion, where processing begins at the center of the onion.

New voxels to be processed are voxels having intensity values less than the threshold indicating that they are blood voxels. Within a particular chamber of the heart, the number of voxels to be processed in each subsequent layer increases until the blood-muscle boundary begins to be encountered. After that time, the number of voxels to be processed within each subsequent layer decreases to a relatively small value.

Eventually, however, the number of voxels to be processed will begin to increase again as the voxels being processed begin to migrate into an adjacent cardiac chamber. For example, if the left ventricle is being processed, eventually the processing space will begin to migrate into the right ventricle, and the number of voxels to be processed will begin to increase. It is when the number of voxels begins to increase after a period of decreasing voxel counts that the method knows that it is time to discontinue processing for the ventricle under analysis.

Figure 3:
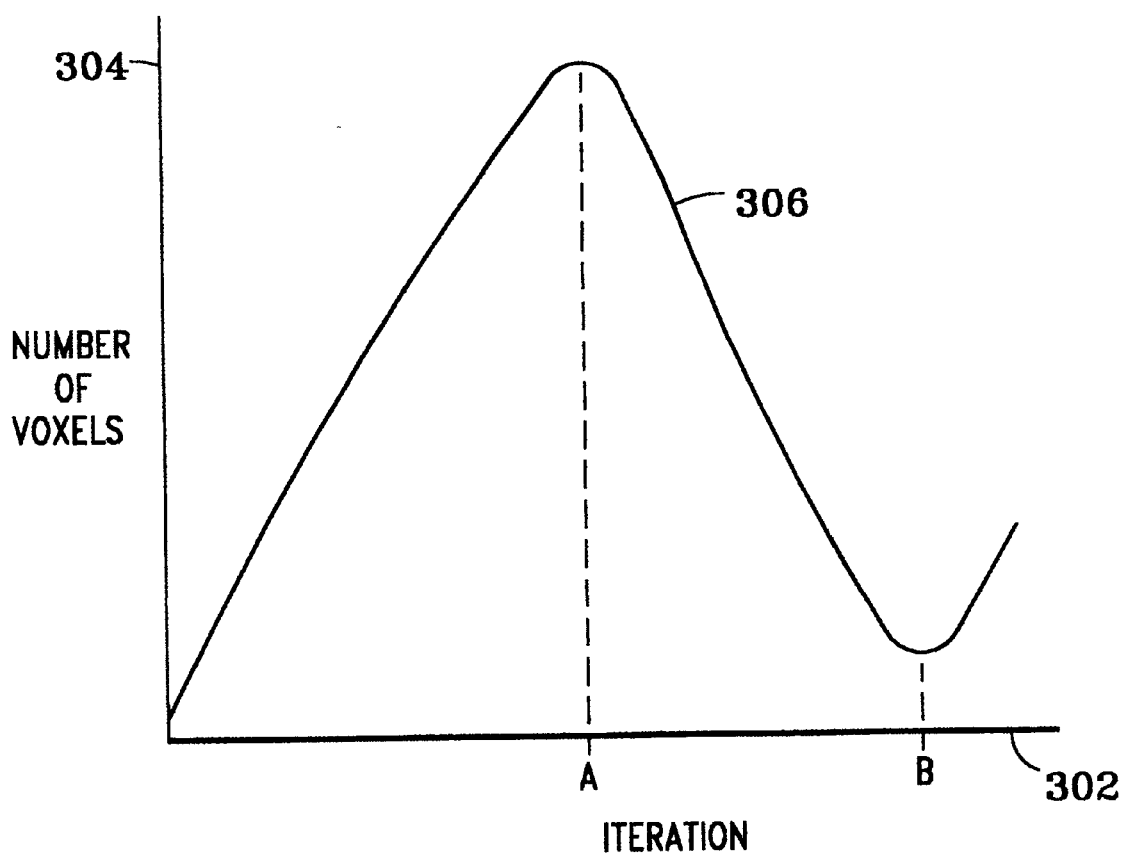
FIG. 3 illustrates an exemplary graph indicating the new voxel count during each iteration of the method of FIG. 2.

FIG. 3 illustrates an exemplary graph indicating the new voxel count during each iteration of the method of FIG. 2. The x-axis 302 represents the processing iteration, starting at the first iteration, and the y-axis 304 indicates the number of voxels to be processed, starting at zero. The function 306 indicates that, after the first iteration during which a single seed voxel is processed, the number of voxels identified to be processed (based on the threshold value) for a next iteration, the processing then continues to increase to iteration "A." Iteration A corresponds to the processing iteration at which the blood-muscle boundary begins to be encountered, based on comparison to the determined threshold. The number of voxels identified to be processed then decreases until iteration "B." Iteration B corresponds to the iteration where the identified voxels begin to migrate into an adjacent cardiac chamber and, thus, the iteration at which processing for the first chamber should cease.

In a preferred embodiment, in order to identify iteration B, the Peak Detected parameter is employed. Initially set to "false" in Step 208, the parameter will be later set to "true" at iteration A. The tendency for the number of voxels to be processed to decrease or increase is then monitored until the number of voxels begins to increase. At that time, the method determines that iteration B has been detected, and processing for the ventricle ceases.

The identification of iteration B establishes the point in the process when to stop processing automatically, thus reducing the processing time and the amount of human intervention necessary to process the data. In various alternate embodiments, iteration B is not identified as previously described. Instead, in a first alternate embodiment, after all of the 4-D data has been processed into images, the operator would examine the images representing the model of the cardiac chamber, and would manually edit out any migration into an adjacent chamber. In another alternate embodiment, an operator could, before or after processing has commenced, pre-establish a processing boundary, such as an ellipse or other shape, around the seed voxel. The ellipse or shape would desirably bound those voxels within the chamber of interest and exclude voxels outside of the chamber of interest. Processing would not continue for those voxels that fall outside the pre-established boundary. The method illustrated in FIG. 2 describes the preferred embodiment, and it would be obvious to one of skill in the art, based on the description herein, to modify the illustrated method to account for the various alternate embodiments.

Referring back to FIG. 2, in step 210 a "Last Count" parameter is initialized to a value of zero. The Last Count parameter is used to monitor the number of voxels that were processed in a preceding iteration. The Last count parameter is needed to determine whether the number of voxels processed during each subsequent iteration is increasing or decreasing. Thus, the Last Count parameter is useful in identifying iterations A and B illustrated in FIG. 3. Because no voxels have been processed prior to the first iteration, the Last Count parameter initially is set to zero.

In a preferred embodiment, the voxels to be processed during a particular iteration are included on a "Neighbor Voxel List." After processing each voxel on the list, the voxels on the list are replaced by the next set of voxels to be processed during the next iteration. In alternate embodiments, the voxels to be processed could be identified in some other manner, as would be obvious to one of skill in the art based on the description herein.

Also in a preferred embodiment, the seed voxel is considered to be a voxel corresponding to blood, since it is desirably located near the center of the chamber of interest. Therefore, the seed voxel is not processed during the first iteration of the method. In alternate embodiments, the seed voxel could be processed during the first iteration and, thus, it would be the only voxel on the Neighbor Voxel List during that iteration. This may prove useful to indicate whether a seed voxel was inappropriately identified. For example, if a seed voxel were selected accidentally within muscle tissue, the intensity value of the seed voxel would likely exceed the threshold. Thus, the operator could be notified that a new seed voxel should be selected. In a preferred embodiment, however, the seed voxel is not processed during the first iteration. Instead, those voxels neighboring the seed voxel are processed.

In step 212, at the first iteration of the outer method loop, the voxels that neighbor the seed voxel are identified for processing by placing those voxels on the Neighbor Voxel List. In a preferred embodiment, eight neighboring 4-D voxels are identified as neighbors to the seed voxel. If the seed voxel were represented in four dimensions as (x,y,z,t), where x,y,z indicate the three spatial dimensions and t represents time, then the eight neighboring voxels could be identified as: (x+1,y,z,t), (x−1,y,z,t), (x,y+1,z,t), (x,y−1,z,t), (x,y,z+1,t), (x,y,z−1,t), (x,y,z,t+1), and (x,y,z,t−1). Thus, the six adjacent spatial neighbors and two temporal neighbors are identified and placed on the Neighbor Voxel List. In alternate embodiments, more or fewer spatial and/or temporal neighbors could be identified.

Next, in step 214, a "New Voxel Count" parameter is initially set to zero. The New Voxel Count parameter indicates, during each iteration of the outer loop, how many of the evaluated voxels have intensity values below the threshold. As with the Last Count parameter, the New Voxel Count parameter is used to determine whether the number of voxels processed during each subsequent iteration is increasing or decreasing.

In step 216, the "next neighbor" is selected for processing from the Neighbor Voxel List. During the first iteration of this interior process loop, the next neighbor would be the first voxel listed on the Neighbor Voxel List. During subsequent iterations, each successive voxel on the list would be selected.

In step 218, a determination is made whether the intensity corresponding to the selected voxel exceeds the blood-muscle threshold selected in step 206. If not, it would indicate that, according to the selected threshold, the voxel corresponds to blood, rather than muscle. Otherwise, it would indicate that the voxel corresponds to muscle.

If it is determined that the voxel intensity is not greater than the threshold, then, in step 220, that voxel is added to a temporary list, referred to herein as the "Blood Voxel List." Then, in step 222, the New Voxel Count is incremented by one, indicating that another voxel in the set of voxels currently being evaluated corresponds to a blood voxel, rather than a muscle voxel.

After steps 220 and 222, or if it is determined that the voxel intensity is greater than the threshold, then, in step 224, a determination is made whether all voxels on the Neighbor Voxel List have been evaluated. If not, then the method returns to step 216, and the next voxel on the Neighbor Voxel List is evaluated.

If all voxels on the Neighbor Voxel List have been evaluated, then the voxels on the Blood Voxel List are stored on a Final Voxel List in step 226. The processing of the Final Voxel List will be discussed in conjunction with steps 236–244.

After step 226, the New Voxel Count value is compared with the Last Count value, in step 228, to determine whether the New Voxel Count value is greater than or equal to the Last Count. During the first iteration of the method, the Last Count value is zero and, thus, the New Voxel Count value will be greater than the Last Count value (unless some error has occurred and no blood voxels were identified from the Neighbor Voxel List).

If the New Voxel Count parameter is less than the Last Count parameter, it would indicate that the number of blood voxels found in the current iteration is less than the number of blood voxels found during the preceding iteration. Referring to FIG. 3, this would correspond to those iterations between iterations A and B. The decrease in blood voxels indicates that some of the voxels evaluated during the iteration (or within that voxel layer) coincide with the heart's muscle tissue.

The first time a decrease in voxel count is detected, it would indicate that the "peak" number of blood voxels has been encountered. This would correspond with iteration A in FIG. 3. Accordingly, in step 230, the Peak Detected parameter is changed to "true" when a decrease in the voxel count is encountered. Even though the method indicates that the Peak Detected parameter is changed to "true" each time a decreasing blood voxel count occurs, the parameter needs to be changed only once.

After step 230, the Last Count parameter is set to the New Voxel Count value in Step 234, and the method returns to step 212 and iterates as shown in FIG. 2. Essentially, during this second (or subsequent) iteration of step 212, the neighbors for each voxel on the previous iteration's Blood Voxel List are identified and placed on the Neighbor Voxel List. In a preferred embodiment, neighbors corresponding to voxels that had been previously evaluated would not be placed on the Neighbor Voxel List, since it would not be necessary to reevaluate those voxels.

Referring back to step 228, if a determination is made that the New Voxel Count value is greater than or equal to the Last Count value, it would indicate that the number of blood voxels found in the current iteration is greater than the number of blood voxels found during the preceding iteration. Referring to FIG. 3, this would correspond to those areas where the voxel count is increasing (or at least staying the same). If the number of blood voxels is increasing, it then becomes necessary to determine whether the increase is due to migration into an adjacent cardiac chamber.

Thus, in step 232, a determination is made whether the Peak Detected parameter is true. If not, it would indicate that the blood voxel increase is not due to migration into an adjacent cardiac chamber and the method would execute step 234, return to step 212, and iterate as described above. As described previously, other methods of determining whether migration into an adjacent cardiac chamber could be employed, as would be obvious to one of skill in the art based on the description herein. For example, the method could cease iterations of steps 212–232 for any of the new blood voxels that fall outside a pre-established boundary (e.g., an ellipse or other shape around the seed voxel).

If the Peak Detected parameter is true, it would indicate that the blood voxel increase is due to migration into an adjacent cardiac chamber, the iterations would cease, and steps 235–244 would be performed. Steps 236–244 essentially describe the post-processing that occurs after all 4-D blood voxels for a particular chamber have been identified and included on the Final Voxel List. Step 235 adjusts the Final Voxel List, prior to the post-processing steps 236–244.

As described above, the 4-D blood voxels included on the Final Voxel List are generated iteratively, starting with the seed voxel in a first iteration of the method, and radiating, in three dimensions, outward from the seed voxel in subsequent iterations. This iterative processing of voxels has been characterized as being analogous to processing elements within subsequent layers of an onion, where processing begins at the center of the onion. Oftentimes however, not every voxel within a given processing layer will indicate correspondence to blood per the threshold test of step 218.

Voxels which do not represent blood do not go onto the Final Voxel List. As such, the blood volume represented by the sum of 4-D blood voxels on the Final Voxel List very likely does not resemble an "onion." More likely, this blood volume resembles "Swiss cheese," where cheese represents blood, and the pockets within the cheese, as well as the outer boundary of the cheese do not represent blood.

The blood volume represented by the sum of 4-D voxels on the Final Voxel List oftentimes underestimates the actual blood volume in the region of interest. One reason for this is a phenomenon known as "partial voluming," where a voxel encompasses both blood and a non-blood substance, such as muscle. Under this circumstance, the threshold test of step 218 will likely not indicate blood correspondence with this "mixed" voxel, causing the voxel to be excluded from the Final Voxel List, though the presence of some blood in the voxel may merit its inclusion on the List. Since partial voluming tends to occur where both blood and non-blood matter reside within a voxel, the external and internal boundaries of the blood volume defined by the Final Voxel List are the most common areas for partial voluming.

Additionally, the blood volume is sometimes underrated as a result of slow or turbulent blood flow. Specifically, slow or turbulent blood flow within a voxel may exhibit (erroneously) non-blood characteristics according to the threshold test of step 218, resulting in omission of the subject voxel from the Final Voxel List, and underestimation of the blood volume.

Since, as discussed above, the blood volume represented by the Final Voxel List may underestimate the actual blood volume in a region of interest, step 235 adjusts the Final Voxel List before the post-processing of steps 236–244. Specifically, for each voxel likely to correspond to blood (e.g., voxels on the Final Voxel List), step 235 determines neighbors and whether the computed neighbors correspond to blood, meaning they are already on the Final Voxel List. And, computed neighbors which are not blood are added to the Final Voxel List.

In essence, step 235 adds a layer of voxels to the internal and external surface boundaries of the blood volume, as those surfaces are defined by the blood voxels on the Final Voxel List (prior to step 235). In a preferred embodiment, step 235 adds a single layer of voxels to these surface boundaries, though additional layers could be added, if desired. Similarly, additional layer(s) of voxels need not be employed, if desired, by omitting step 235.

In step 236, the voxels in the Final Voxel List are counted into "bins" of cardiac phases. Each bin corresponds to a particular phase within a full cardiac cycle of dilation and contraction. In a preferred embodiment, 16 to 24 bins, corresponding to an equal number of cardiac phases, are used to sort the voxels, although more or fewer bins could be used in an alternate embodiment. As indicated previously, each voxel is identified in four dimensions using three spatial and one temporal parameter (e.g., (x,y,z,t)). The temporal parameter for each voxel is used to sort the voxels into the phase bins.

Once the voxels are sorted, one or more images of the analyzed chamber during each cardiac phase are reconstructed in step 238. In a preferred embodiment, multiple two-dimensional images, one for each cardiac slice, would be obtained for each cardiac phase. In an alternate embodiment, a three-dimensional image for each cardiac phase could be reconstructed. If desired, these two- or three-dimensional images could be used to create an animated model of the cardiac functionality.

From these images, the ventricular volume is determined during each cardiac phase in step 240. In a preferred embodiment, the ventricular volume for a particular cardiac phase is equal to the sum of the number of voxels in the slices times the voxel volume, usually measured in milliliters. Alternatively, the ventricular volume could be calculated as the cross-sectional area of each slice times the thickness of each slice. The thickness of the slice was pre-specified by the operator, and the two-dimensional, cross-sectional area of each slice is determined from the image obtained from the sorted voxels. In alternate embodiments, the area of the chamber could be calculated in other ways, as would be obvious to one of skill in the art based on the description herein.

In step 242, the largest and smallest ventricular volumes are determined from the volume information obtained in step 240. The largest volume would correspond to the cardiac phase during which the heart is at maximum dilation, and the smallest volume would correspond to the cardiac phase during which the heart is at maximum contraction.

From this information, the ejection fraction is calculated in step 244 and the method ends. The ejection fraction is a function of the difference between the largest and smallest ventricular volume, and indicates the fraction of blood that is ejected from the chamber during a cardiac cycle. As stated previously, the ejection fraction is a useful item of information in evaluating the proper functioning of a heart.

As an example, in a preferred embodiment, the ejection fraction for the left ventricle is calculated by counting the voxels at end-diastole, ED, and end-systole, ES. Both voxel counts are multiplied by the voxel volume, yielding the maximum (at ED) and minimum (at ES) volumes of the left ventricle. The ejection fraction, EF, is calculated as:

$$EF = [(ED\ \text{volume}) - (ES\ \text{volume})]/(ED\ \text{volume}).$$

In various other embodiments, different parameters affecting cardiac functioning also could be determined using the data obtained from the method and apparatus of the present invention. For example, one of skill in the art could calculate blood flow, total cardiac output, cardiac enlargement, and other parameters using the data obtained using the method and apparatus of the present invention.

Figure 4:
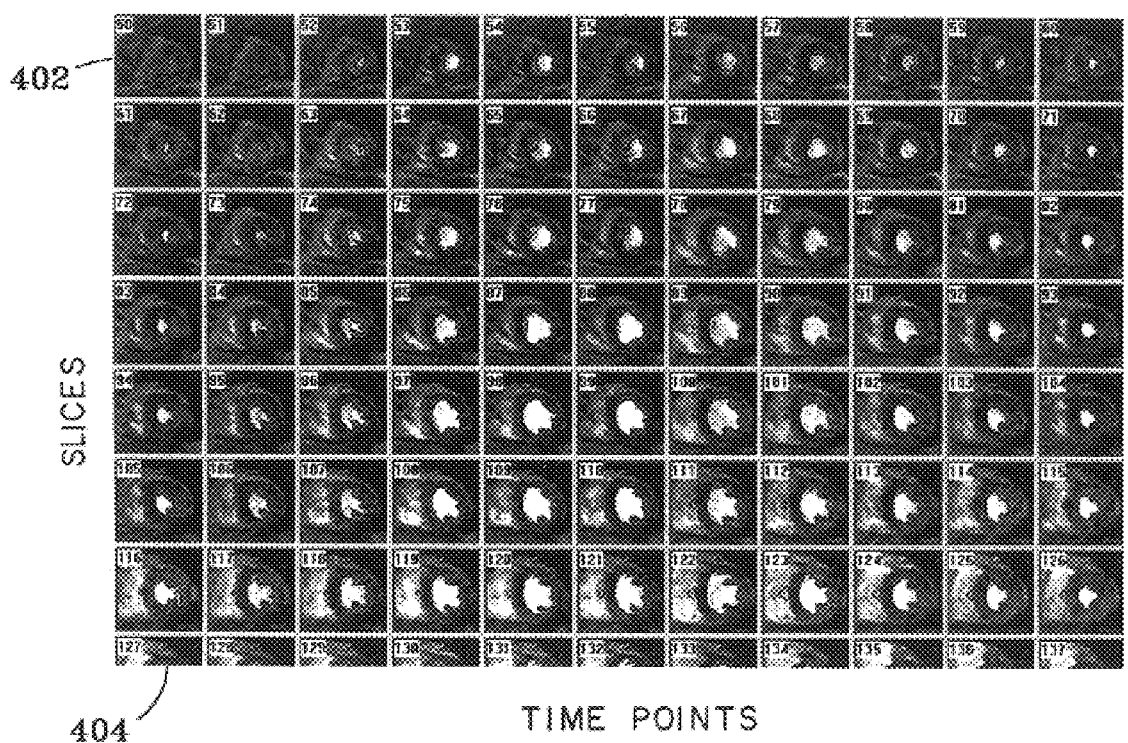
FIG. 4 illustrates an exemplary set of images obtained by employing the method of the preferred embodiment.

FIG. 4 illustrates an exemplary matrix of images obtained by employing the method of the preferred embodiment. As illustrated, the images have been organized and displayed on a personal computer monitor. Each row 402 shows images of a particular slice during each cardiac phase, and each column 404 shows images of the multiple slices during a single cardiac phase.

As can be seen by the image matrix displayed in FIG. 4, the method and apparatus of the present invention enable a medical professional easily to view the cardiac functioning of a particular patient. Another significant advantage of the method and apparatus is that, unlike prior art methods, very little operator intervention is necessary to obtain a full set of cardiac images and to determine parameters, such as ejection fraction, that describe the cardiac functionality. This advantage is achieved, in part, because the operator is not required to manipulate hundreds of images that describe each slice of the heart during each cardiac phase. In addition, by eliminating most operator interaction, the results obtained using the method and apparatus of the present invention are more accurate and reproducible than prior art methods and apparatuses.

Thus, a method and apparatus for producing high-quality, 3-D images of cardiac function over time has been described which overcomes specific problems, and accomplishes certain advantages relative to prior art methods and mechanisms. The foregoing descriptions of the specific embodiments will so fully reveal the general nature of the invention that others can, by applying current knowledge, readily modify and/or adapt the embodiments for various applications without departing from the generic concept. Therefore, such adaptations and modifications should, and are intended to be comprehended within the meaning and range of equivalents of the disclosed embodiments.

In particular, while a preferred embodiment has been described using various lists (e.g., Neighbor Voxel List, Blood Voxel List, and Final Voxel List), one of skill in the art would understand, based on the description herein, that the analyzed voxels could be separated and stored in other configurations (e.g., all on one list or on various different lists). In addition, although the method has been described using various parameters (e.g., Peak Detected, Last Count, and New Voxel Count), other ways of determining whether analyzed voxels are migrating into an adjacent cardiac chamber also could be implemented, as would be obvious to one of skill in the art based on the description herein.

In addition, the method and apparatus of the present invention can be used in applications other than determining cardiac functionality. For example, the method and apparatus could be used to image numerous other cyclic functions in which solid, liquid, and/or gaseous matter is taken into and expelled from a chamber or cavity.

Additionally, those skilled in the art understand that cardiac imaging may represent blood as either dark or light, so-called "black blood" or "white blood," respectively. In the above description, reference has been made to black blood imaging, though implementation of white blood imaging is within the scope of the present invention.

Moreover, those skilled in the art will appreciate that the flowchart presented herein is intended to teach the present invention, and that different techniques for implementing program flow, including techniques that do not necessarily lend themselves to flowcharting, may be devised. For example, each task discussed herein may be interrupted to permit program flow to perform background or other tasks. In addition, the specific order of tasks may be changed, and the specific techniques used to implement the tasks may differ from system to system.

It is to be understood that the phraseology or terminology employed herein is for the purpose of description, and not of limitation. Accordingly, the invention is intended to embrace all such alternatives, modifications, equivalents, and variations as fall within the spirit and broad scope of the appended claims.

What is claimed is:

1. A method for analyzing cardiac functionality of a heart comprising the steps of:
   a) acquiring a set of image data that includes respective intensity values for four-dimensional voxels within a region of interest;
   b) identifying a seed voxel from the four-dimensional voxels;
   c) identifying neighbor voxels to the seed voxel;
   d) determining, for each of the neighbor voxels, whether an intensity value corresponding to each neighbor voxel indicates that the voxel is likely to correspond to blood or to muscle tissue;
   e) for the set of the neighbor voxels having the intensity values that are likely to correspond to blood, determining new neighbors to the set of neighbor voxels;
   f) repeating steps d and e for the new neighbors until all voxels of interest have been evaluated, resulting in a final set of voxels, each of which has an intensity value that is likely to correspond to blood;
   g) identifying voxels neighboring the final set of voxels and which have intensity values not likely to correspond to blood, and adding said neighboring voxels to the final set of voxels; and
   h) reconstructing one or more cardiac images from the final set of voxels.

2. The method as claimed in claim 1, wherein the step of acquiring the set of image data comprises the step of acquiring the data for the four-dimensional voxels, wherein each of the four-dimensional voxels is described by three spatial variables and one temporal variable.

3. The method as claimed in claim 1, wherein the step of identifying the seed voxel comprises the step of identifying the seed voxel as a voxel in a center region of a cardiac chamber.

4. The method as claimed in claim 1, wherein the step of identifying the neighbor voxels to the seed voxel comprises the steps of identifying multiple spatially-adjacent voxels and multiple temporally-adjacent voxels, each of which is adjacent either spatially or temporally to the seed voxel.

5. The method as claimed in claim 1, wherein the step of determining whether the intensity value indicates that the voxel is likely to correspond to blood or to muscle tissue comprises the steps of:
   comparing the intensity value to a threshold;
   if black blood imaging is employed and the intensity value is less than the threshold, determining that the intensity value indicates that the voxel is likely to correspond to blood;
   if black blood imaging is employed and the intensity value is greater than the threshold, determining that the intensity value indicates that the voxel is likely to correspond to muscle tissue;
   if white blood imaging is employed and the intensity value is less than the threshold, determining that the intensity value indicates that the voxel is likely to correspond to muscle tissue; and
   if white blood imaging is employed and the intensity value is greater than the threshold, determining that the intensity value indicates that the voxel is likely to correspond to blood.

6. The method as claimed in claim 1, wherein the step of repeating comprises the step of repeating steps d and e of claim 1until the new neighbors begin to migrate into an adjacent cardiac chamber.

7. The method as claimed in claim 6, further comprising the steps of:
   determining a first number of new neighbors that were identified during a first iteration of steps d and e;
   comparing the first number of new neighbors to a second number of new neighbors that were identified during a previous iteration of steps d and e; and
   if the first number is greater than the second number, determining whether an increase in the number of new neighbors is due to migration into the adjacent cardiac chamber.

8. The method as claimed in claim 7, wherein the step of determining whether the increase is due to migration comprises the steps of:
   determining whether a peak in the number of new neighbors has occurred, where the peak was followed by a decrease in the number of new neighbors between successive iterations; and if the peak has occurred, determining that the increase is due to migration into the adjacent cardiac chamber.

9. The method as claimed in claim 1, wherein the step of repeating comprises the steps of:

determining whether any of the new voxels fall outside of a preestablished boundary; and not repeating steps d and e for those new voxels that fall outside of the pre-established boundary.

10. The method as claimed in claim 1, further comprising the step of separating voxels in the final set of voxels into bins corresponding to respective cardiac phases.

11. The method as claimed in claim 10, wherein the step of reconstructing one or more cardiac images comprises the step of reconstructing a two dimensional image for each cardiac slice within each bin of cardiac phases.

12. The method as claimed in claim 10, wherein the step of reconstructing one or more cardiac images comprises the step of reconstructing a three-dimensional image for each bin of cardiac phases.

13. The method as claimed in claim 1, wherein the step of reconstructing one or more cardiac images comprises the step of creating an animated model of the cardiac functionality.

14. The method as claimed in claim 1, further comprising the step of:

i) calculating an ejection fraction for one or more ventricles of the heart based on the one or more cardiac images.

15. The method as claimed in claim 14, wherein the step of calculating the ejection fraction comprises the steps of:

identifying, from the one or more cardiac images, a largest ventricular volume and a smallest ventricular volume; and calculating the ejection fraction as a function of a difference between the largest ventricular volume and the smallest ventricular volume.

16. The method as claimed in claim 14, wherein the step of calculating the ejection fraction comprises the steps of:

counting a first number of voxels in a ventricle at end-diastole ("ED");

counting a second number of voxels in the ventricle at end-systole ("ES");

multiplying the first number by a voxel volume, resulting in the largest ventricular volume;

multiplying the second number by the voxel volume, resulting in the smallest ventricular volume; and calculating the ejection fraction as the largest ventricular volume minus the smallest ventricular volume, then divided by the largest ventricular volume.

17. The method as claimed in claim 1, wherein the step of identifying voxels neighboring the final set of voxels and which have intensity values not likely to correspond to blood comprises the steps of identifying, for each voxel on the final set of voxels, multiple spatially-adjacent voxels and multiple temporally-adjacent voxels, each of which is adjacent either spatially or temporally to a voxel on the final set of voxels.

18. An apparatus for analyzing cardiac functionality comprising:

an imaging system that acquires image data including intensity values for four-dimensional voxels within a region of interest; and an image processor, coupled to the imaging system, that identifies neighbor voxels to a seed voxel of the four-dimensional voxels, determines, for each of the neighbor voxels, whether an intensity value corresponding to each neighbor voxel indicates that the voxel is likely to correspond to blood or to muscle tissue, and for the set of the neighbor voxels having the intensity values that are likely to correspond to blood, determines new neighbors to the set of neighbor voxels, and the image processor continues to determine whether the intensity value is likely to correspond to blood or muscle tissue and to determine the new neighbors until all voxels of interest have been evaluated, resulting in a final set of voxels, each of which has an intensity value that is likely to correspond to blood, identifies voxels neighboring the final set of voxels and which have intensity values not likely to correspond to blood, and adds said neighboring voxels to the final set of voxels, and reconstructs one or more cardiac images from the final set of voxels.

19. The apparatus as claimed in claim 18, wherein the imaging system is a nuclear magnetic resonance imaging system.

20. A method for analyzing cardiac functionality of a heart comprising the steps of:

a) acquiring a set of image data that includes intensity values for four-dimensional voxels within a region of interest;

b) generating iteratively a final set of voxels with intensity values likely to correspond to blood, said final set representing a region of interest in the heart;

c) identifying voxels neighboring the final set of voxels and which have intensity values not likely to correspond to blood, and adding said neighboring voxels to the final set of voxels; and d) reconstructing one or more cardiac images from the final set of voxels.

* * * * *